United States Patent [19]

Henzi et al.

[11] Patent Number: 4,962,464
[45] Date of Patent: Oct. 9, 1990

[54] SERPENTINE COLUMNAR PLOTTING SYSTEM

[75] Inventors: Max P. Henzi, Concord; Marius Matoic, Berkeley, both of Calif.

[73] Assignee: Lavenir Technology, Inc., Pleasant Hill, Calif.

[21] Appl. No.: 341,319

[22] Filed: Apr. 20, 1989

Related U.S. Application Data

[63] Continuation of Ser. No. 17,668, Feb. 24, 1987, abandoned.

[51] Int. Cl.$^5$ .............................................. G06F 15/62
[52] U.S. Cl. .................................... 364/518; 358/296; 358/474; 358/494; 358/497
[58] Field of Search .............. 358/78, 296, 298, 302, 358/413, 474, 494, 495, 497; 355/70; 346/107 R, 108, 1.1, 76 L; 354/4, 7; 364/520, 518

[56] References Cited

U.S. PATENT DOCUMENTS

| | | | |
|---|---|---|---|
| 4,240,117 | 12/1980 | Wellendorf et al. | 358/296 |
| 4,247,872 | 1/1981 | Wada et al. | 358/474 |
| 4,268,870 | 5/1981 | Kitamura et al. | 358/497 |
| 4,435,064 | 3/1984 | Tsukada et al. | 355/70 X |
| 4,566,015 | 1/1986 | MacKenzie | 346/107 R |
| 4,636,871 | 1/1987 | Oi | 358/296 |
| 4,730,219 | 3/1988 | Oshikoshi et al. | 358/293 X |

Primary Examiner—Gary V. Harkcom
Assistant Examiner—Mark K. Zimmerman
Attorney, Agent, or Firm—Townsend and Townsend

[57] ABSTRACT

A computer controlled photoplotter includes a row of LED's (light emitting diodes) mounted to a light head positioned parallel to the film width. The light head is part of a light head assembly which is moved parallel to the film length. At the end of each pass the lighthead is indexed widthwise a short distance. During each lengthwise pass the LED's are illuminated at appropriate positions to expose the film at those positions according to the image being plotted. The computer receives the image data in vector form—typically end points, widths of lines and particular shapes are provided. The vector data is rasterized for only those columnar positions underlying the LED's for each pass. That is, columnar rasterization is accomplished by determining the desired state of each LED at each position along a columnar path. This data is stored in a first memory area; as the light head moves along one pass, the data for the next pass is computed and stored in a second memory area in the manner of a dual-ported buffer.

15 Claims, 10 Drawing Sheets

Microfiche Appendix Included
(1 Microfiche, 29 Pages)

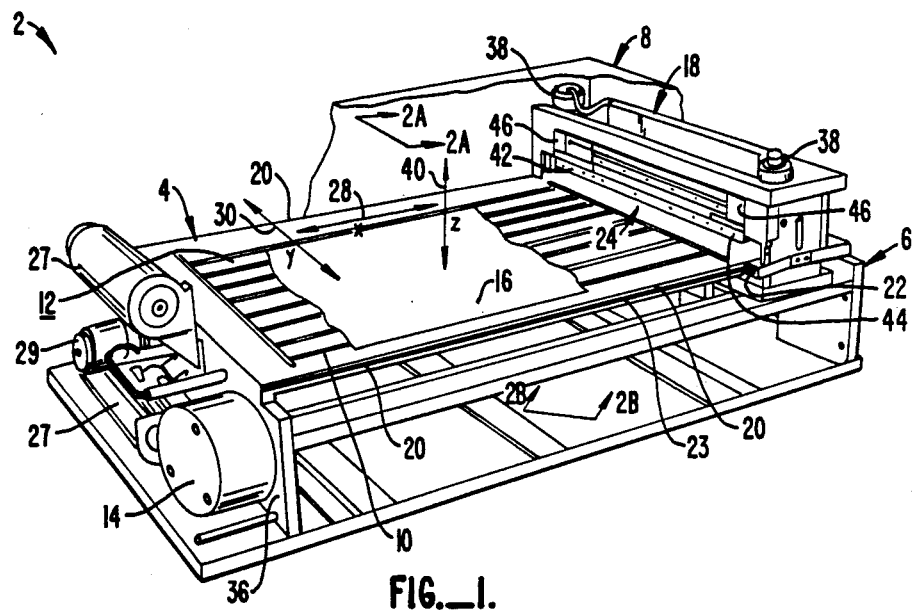
FIG.__1.
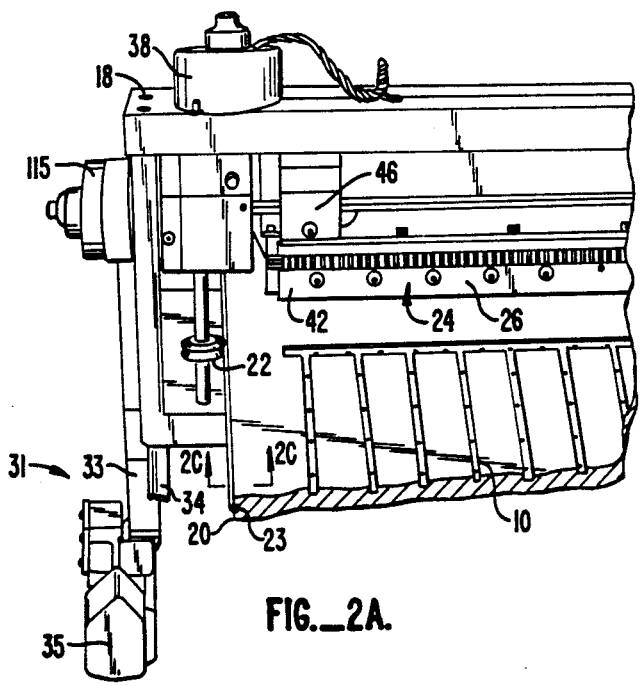
FIG.__2A.
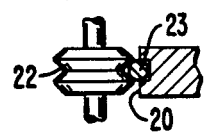
FIG.__2C.

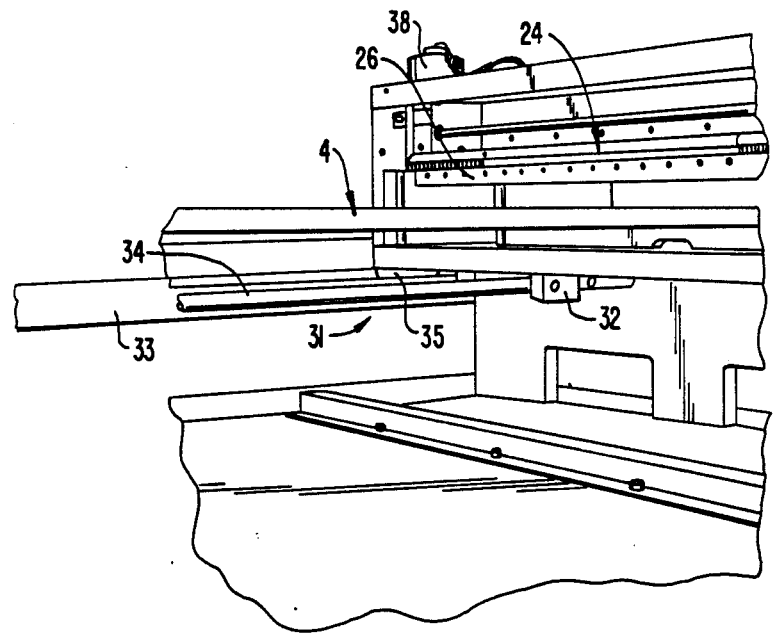
FIG._2B.
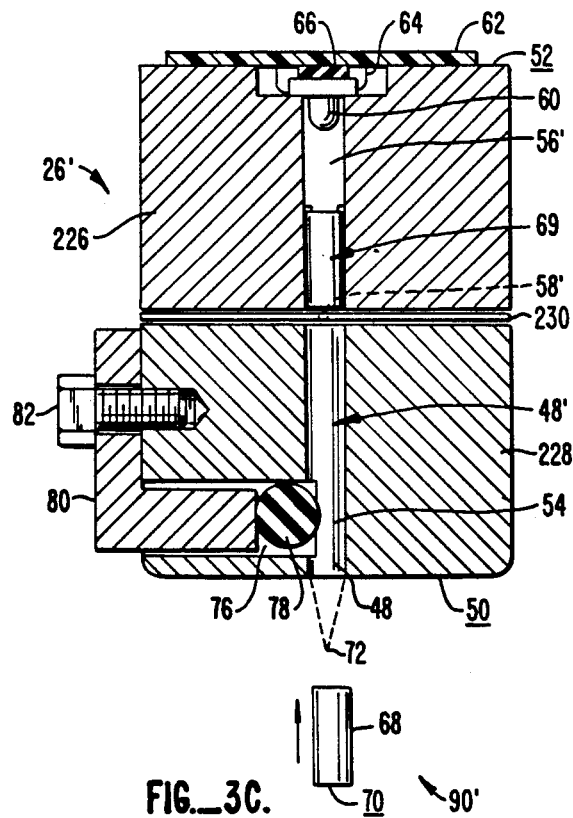
FIG._3C.

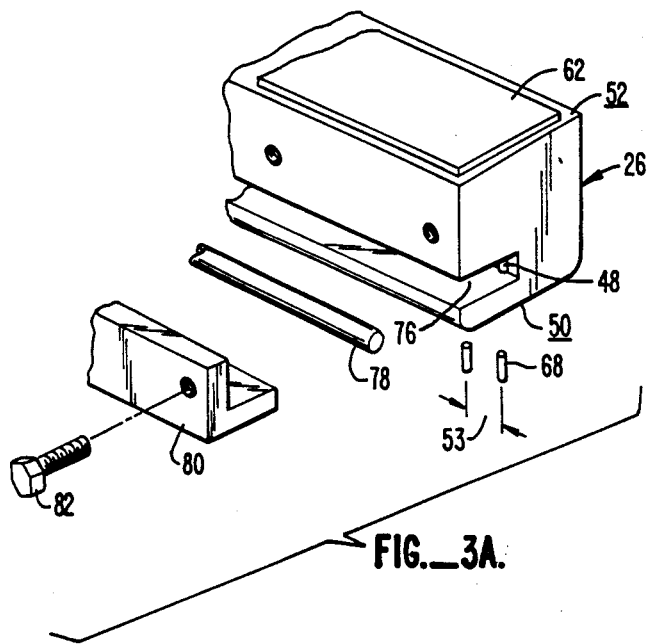
FIG._3A.
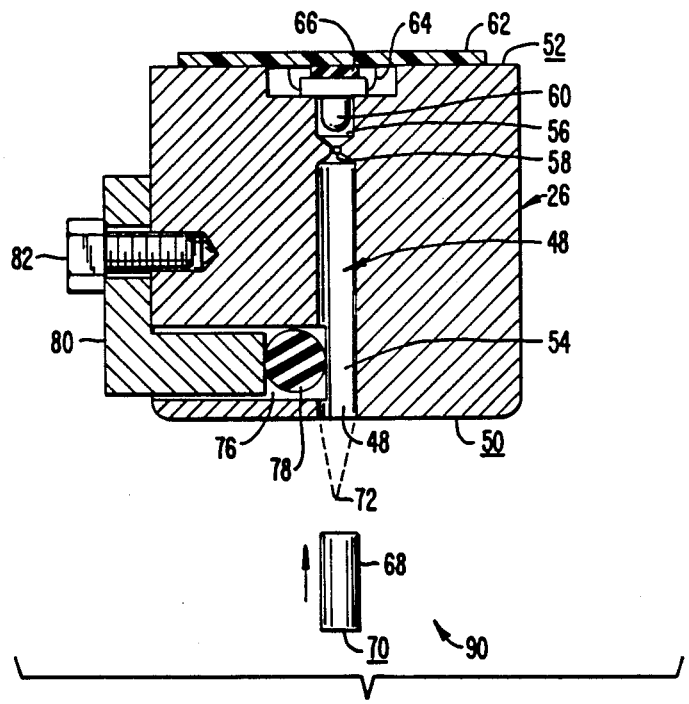
FIG._3B.

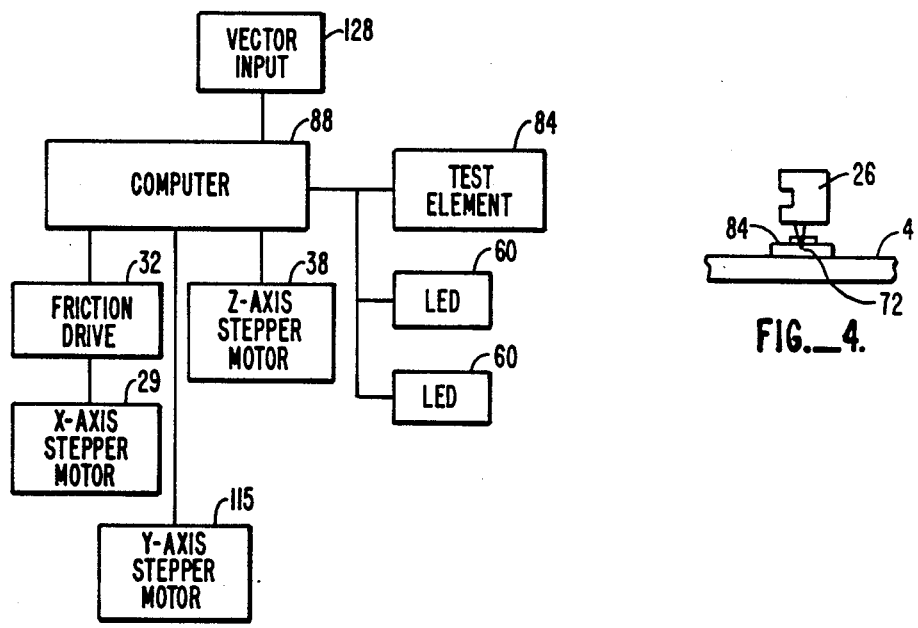
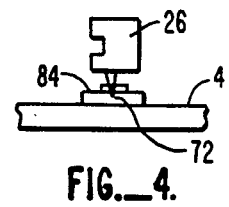
FIG._4.
FIG._5.
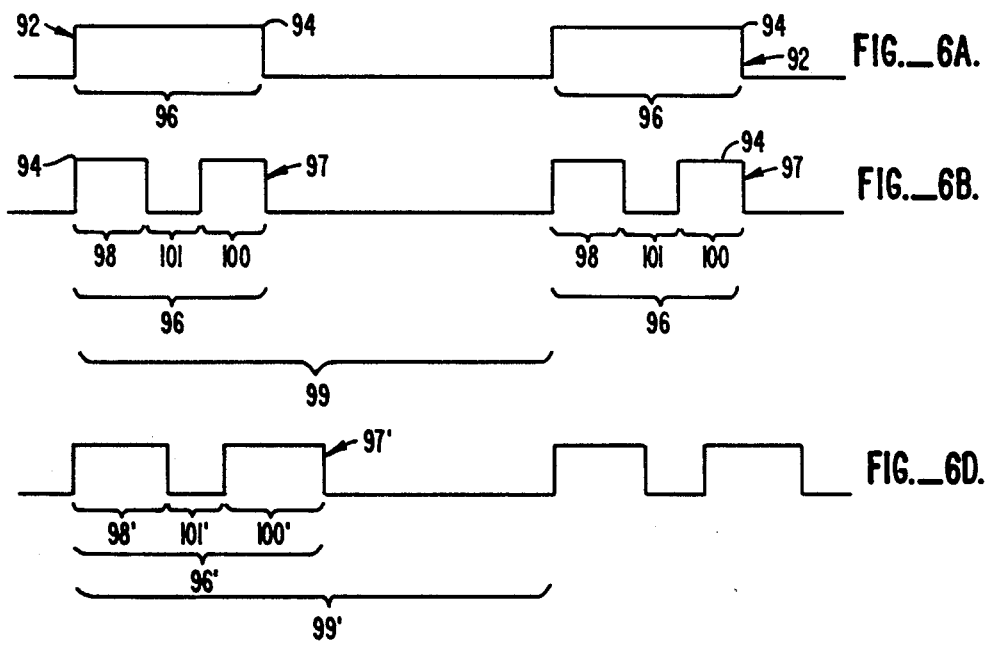
FIG._6A.
FIG._6B.
FIG._6D.

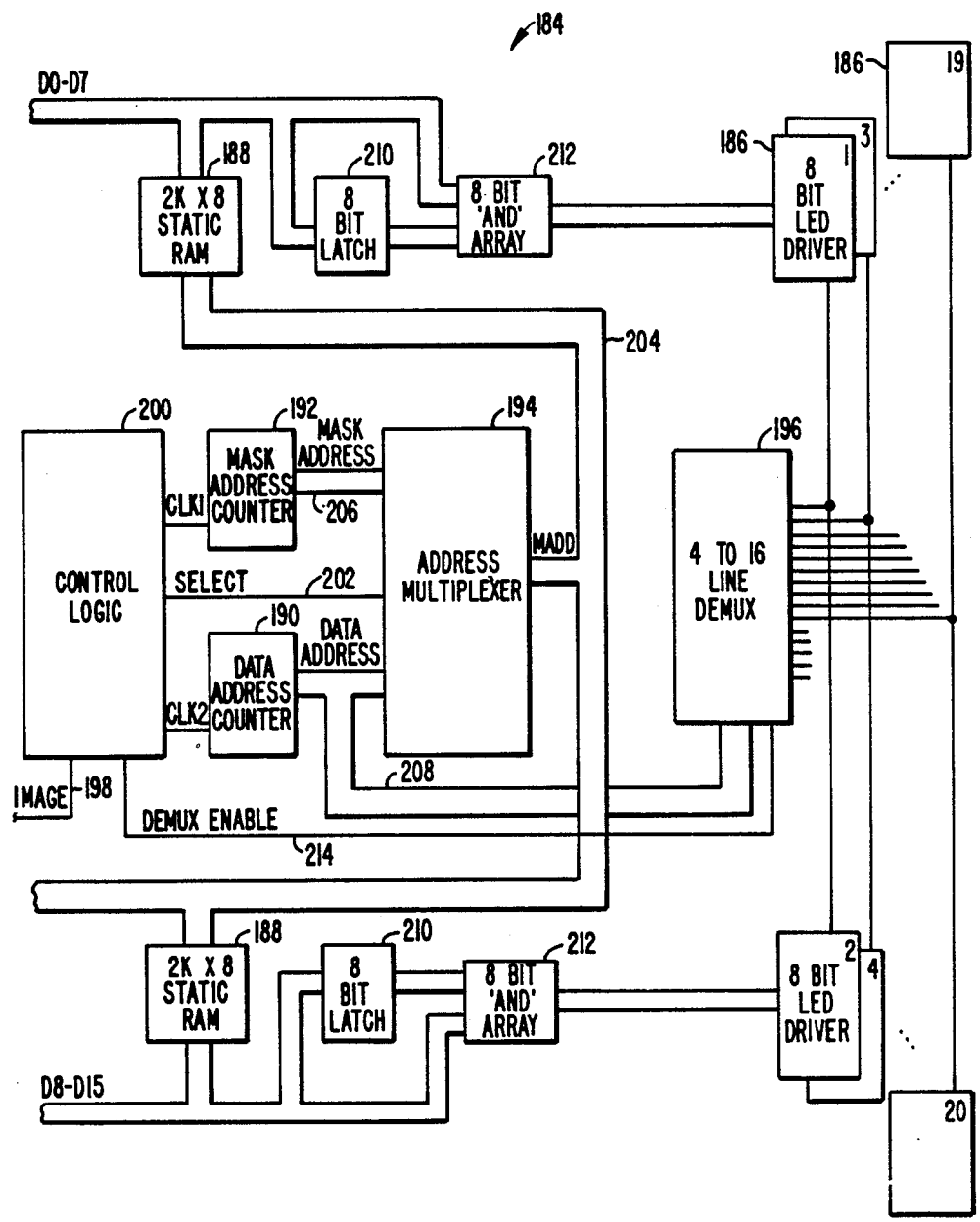
FIG._6C.

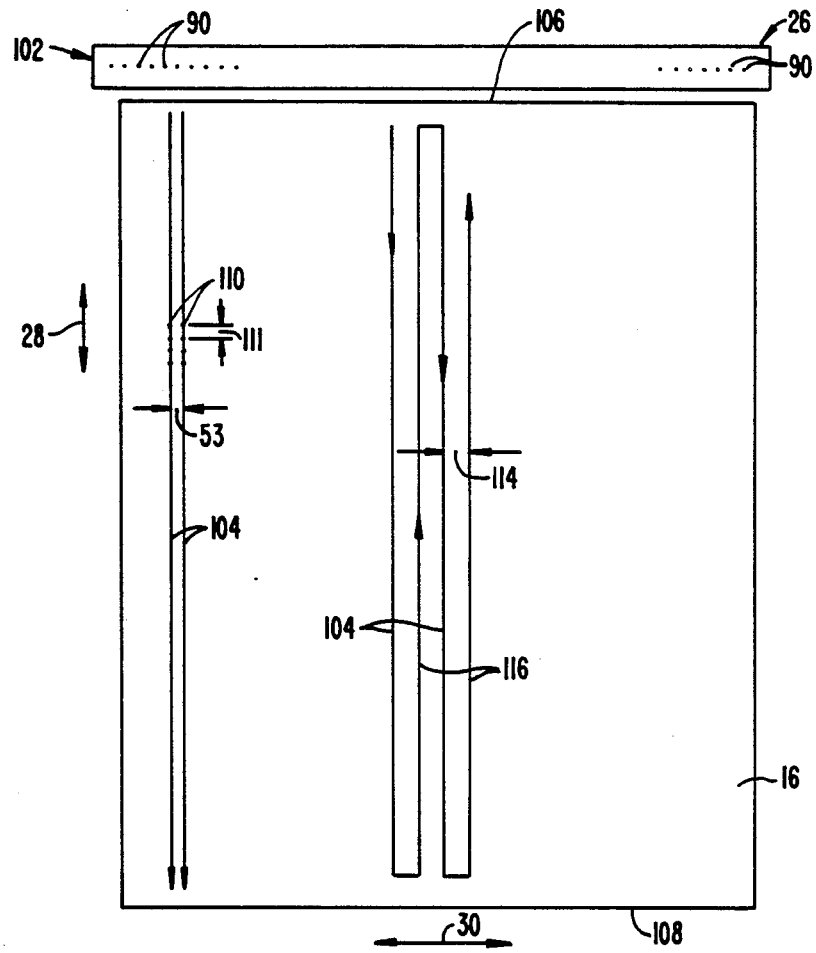
FIG.\_7.
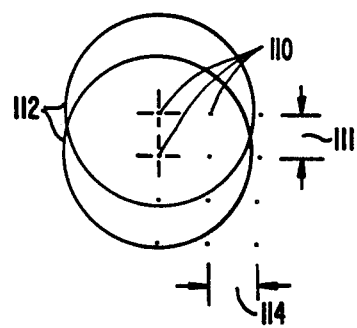
FIG.\_8.

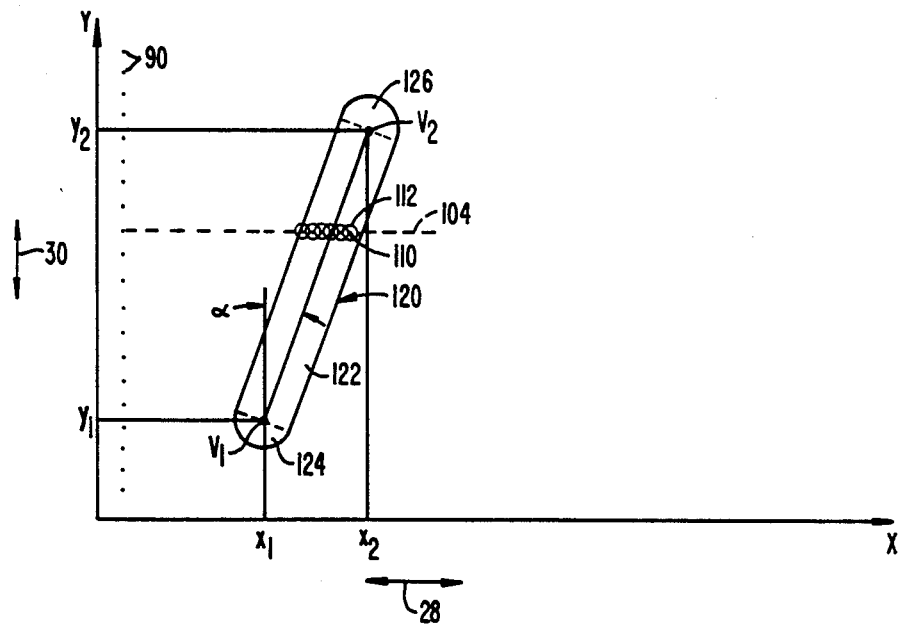
FIG._9.
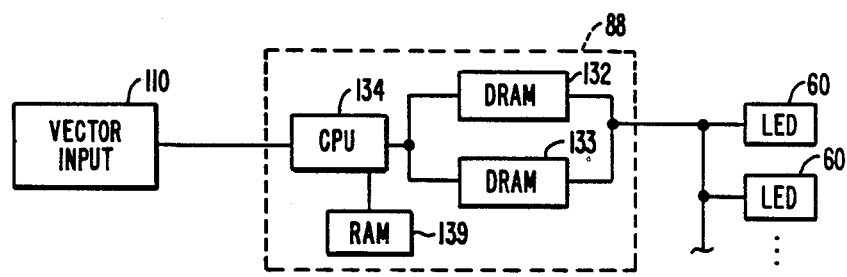
FIG._10.

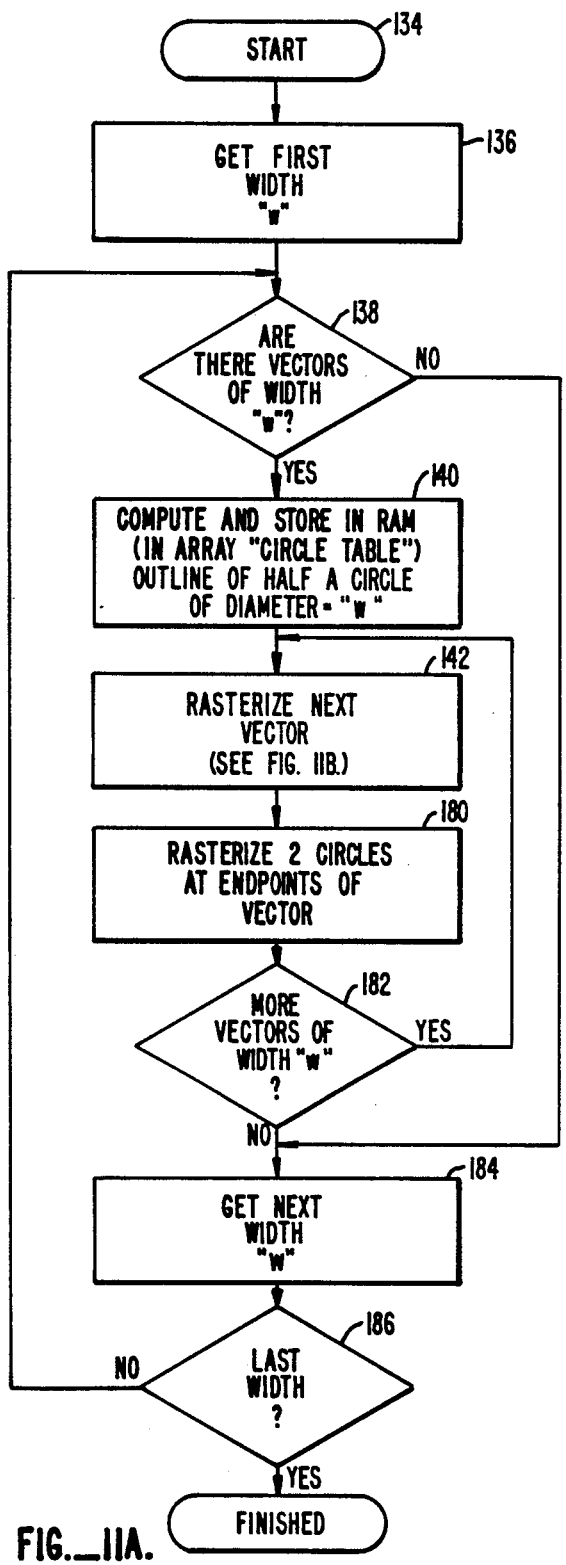
FIG._11A.

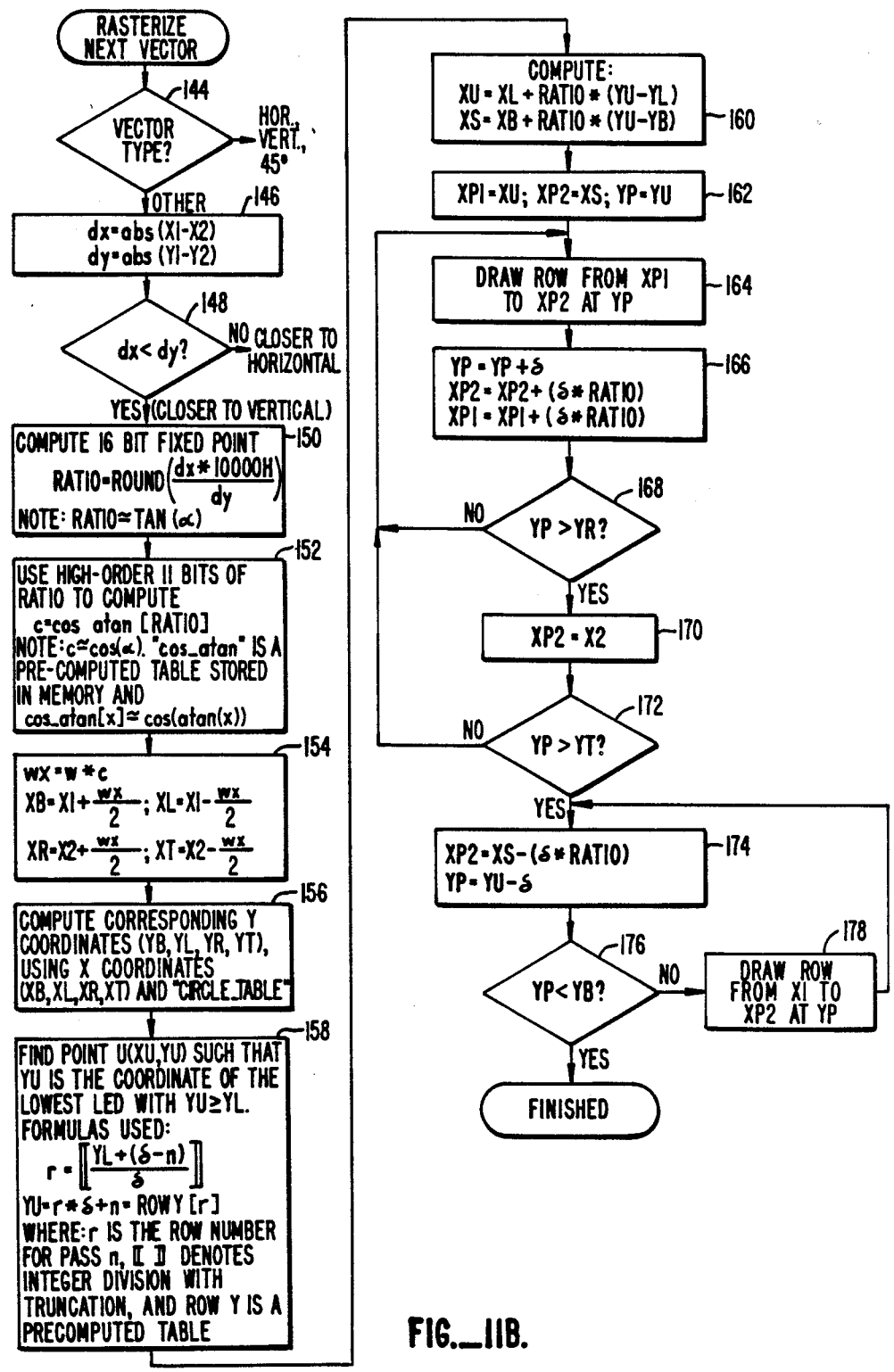
FIG._11B.

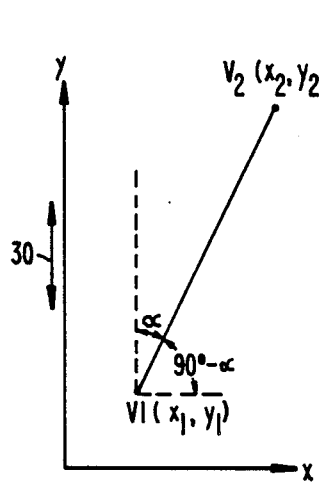
FIG._12A.
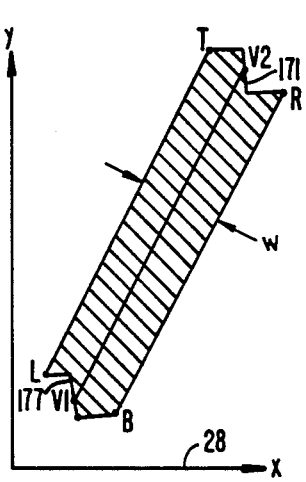
FIG._12B.
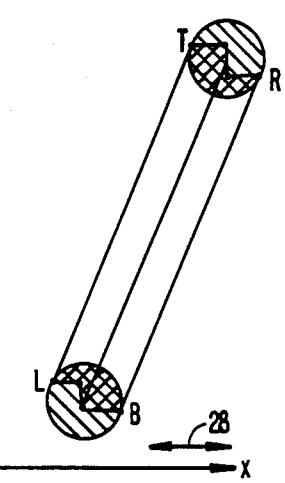
FIG._12C.
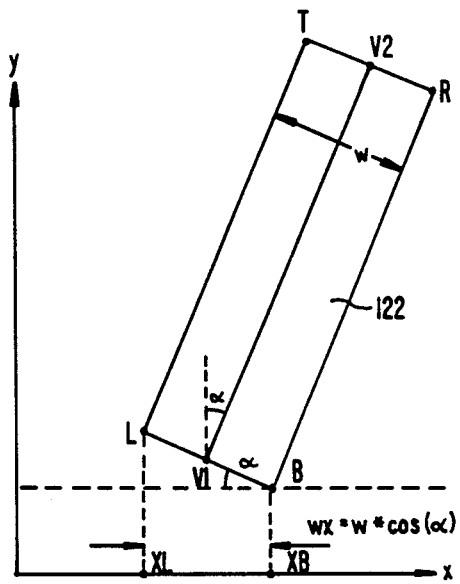
FIG._12D.
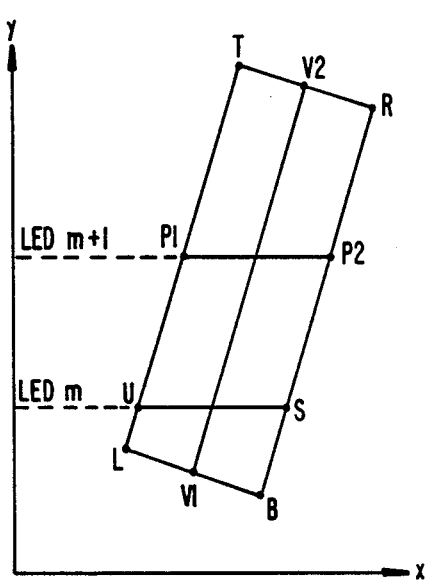
FIG._12E.

SERPENTINE COLUMNAR PLOTTING SYSTEM

This is a continuation of application Ser. No. 07/017,668, filed Feb. 24, 1987, now abandoned.

BACKGROUND OF THE INVENTION

Photoplotters are widely used to generate precision artwork for the creation of printed circuit boards. Two primary techniques are used in the design of current photoplotters. Calligraphic plotters draw with light on film much like pen plotters are used to draw with a pen on paper. Commonly, light from a quartz halogen lamp or a xenon flash tube is passed through one of a selectable set of apertures, focused on the film and moved by some sort of two axis orthogonal mechanism. Raster photoplotters employ a scanning technique similar to the way images are created by an electron beam on a cathode ray tube. With raster photoplotters, a laser light source is commonly focused onto a highspeed acousto-optic modulator which turns the beam on and off. The modulated beam is then imaged onto a rapidly rotating polygonal mirror which scans the beam across the face of a light sensitive film. The film moves perpendicularly to the modulated beam. The plot is imaged line by line as a series of dots.

The presently used techniques have advantages and disadvantages. Raster photoplotters are relatively quick (30 seconds to 3 minutes per page). The plot time is independent of image density. However, the costs to build, test and service these raster photoplotters make them quite expensive. Calligraphic plotters, on the other hand, exhibit plot times directly proportional to the density of the plotted image. For a densely imaged plot, plot times can exceed several hours. However, calligraphic plotters, although not inexpensive, are substantially cheaper than raster plotters.

SUMMARY OF THE INVENTION

The present invention is directed to a serpentine columnar addressing method for creating an image on a printing medium, such as photographic film, using a rasterization process. A row of image markers, commonly LED's, are positioned in a line. The image markers are moved in unison relative to the printing medium in a direction generally perpendicular to the line of image markers. This relative movement is preferably accomplished by moving the row of image markers over a printing medium. The row of image markers are stopped at the end of the image area on the printing medium and then indexed an index distance transverse to the columnar direction (i.e., along the row).

Next, the row of image markers are moved over the printing medium in a return columnar direction, opposite the last columnar direction, back to the start position. The image markers are actuated, that is the LED's are illuminated, at chosen columnar positions during the movement in at least one of the columnar and return columnar directions to create image marks on the printing medium. Preferably, the image markers are actuated while the row of image markers are moved in both the columnar and the return columnar directions. The process is repeated until the entire image area on the printing medium has been traversed or scanned by the image markers. Since the image markers are preferably equally spaced, this occurs after the row of image markers has been indexed a total distance equal to the distance between the image markers.

In the preferred embodiment, the index distance and the interposition distance between adjacent columnar positions are both equal to 0.0254 mm (0.001 in.) while the distance between the image markers is 2.54 mm (0.1 in.). Therefore it takes 100 passes of the row of image markers to create the image. Of course, other spacings can be chosen as well.

In the preferred embodiment the data for each of the 100 passes is computed by a transformation of vector input data into rasterized data. The vector input data is received by a computer (microprocessor) which controls the operation of the photoplotter. The vector to raster transformation is done during the plot, that is on-the-fly. The computer computes a first set of image mark data for each columnar position for each image marker for one pass between the start and stop positions. Assuming that the image area on the printing medium is 40.64 cm (16 in.) wide, that is in the direction of the row of LED's, by 50.8 cm (20 in.) long, and assuming that there are 160 LED's spaced 2.54 mm (0.1 in.) apart, the first set of image mark data will be a set of discrete points along 160 columns corresponding to the positions of the 160 LED's over the image area of the printing medium. The image mark data is thus produced by a rasterization of, typically, vector data into discrete bit-mapped position data. The invention is also well suited for use in straight raster applications, that is when the data is available in bit-mapped form so no vector to raster transformation is required.

The position data is expressed as a position on the printing medium which is either exposed by an LED or not exposed by an LED. The position data is provided through a dual port buffer. The first set of image mark data is written, that is bit-mapped, into a first memory area, typically a dynamic random access memory (DRAM). A second set of image mark data, corresponding to the portions of the image to be printed in the adjacent columnar positions during the next pass of the image markers after the index step, is then computed and written into a second DRAM. The first and second DRAM's can be different areas on the same chip. The image markers are actuated according to the image mark data in the first DRAM while the computer is computing and writing the second set of image mark data into the second DRAM. The image markers are actuated according to the second set of image mark data in the second DRAM while the computer computes and writes the image mark data for the next pass into the first DRAM. Printing delays are minimized by this procedure.

This columnar addressing scheme has many advantages over the prior art photoplotting methods. It can use low energy light sources, such as LED's, with their relatively low power dissipation. By virtue of the columnar addressing system, the carriage assembly, to which the LED's are mounted, are subject to relatively low accelerations. The carriage assembly is moved along the columnar direction by relatively simple drive mechanism, such as a stepper motor. The light head portion of the carriage assembly, to which the LED's are directly mounted, itself is moved only a very short index distance between passes along the length of the printing medium. The low accelerations and simple movements to which the apparatus is subjected lowers the cost of construction. The low accelerations of the light head also allows the optical elements, discussed below, to be simply but securely mounted to the light head. The total Y-axis movement of the light head is also relatively small—equal to the distance between the LED's. This simplified construction greatly reduces the cost of both manufacture and maintenance as compared with systems in which the row of light sources are shuttled back and forth as they move along the length of the printing medium.

An embodiment of the photoplotter made according to the invention exhibits typical plot times of 20 minutes for image areas measuring about 40 cm×50 cm and 8 minutes for image areas measuring about 20 cm×25 cm. Like presently available raster photoplotters, the plot time is independent of the plot density. Although somewhat slower than the presently available raster photoplotter, the purchase cost for the present photoplotter is about 10 to 20 times less. This great reduction in cost results from using relatively inexpensive components (e.g., LED's versus lasers and spinning mirrors), as well as from designing the plotting routine such that the apparatus is subjected to low accelerations and simplified movements as discussed above.

The present invention is also less expensive to purchase, up to 5 times less expensive, than existing calligraphic photoplotters. However, the plot times for even moderately dense plots are several times greater with such calligraphic plotters. Also, maintenance costs, due to the relatively simple construction possible with the present invention, should be less than with the prior art calligraphic photoplotters.

One of the main uses for photoplotters is the creation of film masks used in creating printed circuit boards. The printed circuits on a printed circuit board commonly include three shapes: circles, rectangles and rectangles with semicircular ends. The circuit description is typically provided in vector form. For example, a portion of a circuit to be plotted would be defined by providing the endpoints of a line defining the center of an elongate rectangle, the width of the rectangle and whether or not the ends are semicircular or flat.

One method for rasterizing the data, that is transforming the vector data into a bit-mapped form for use in turning the LED's on and off at the millions of positions on the image area of the film, is to precompute all data and provide it for use from a single memory containing bits corresponding to each columnar position. The memory required for large (e.g. 40 cm×50 cm) plots would be very expensive.

To accommodate this raster data without needing to precompute and store the data, the invention uses specialized vector-to-raster programming techniques. The rasterization program reduces the size of required memory to a reasonable amount by accomplishing the vector-to-raster transformation on-the-fly as discussed above. Doing so substantially eliminates any dependence of the mechanical plot time upon the vector-to-raster transformation.

The rasterization program preferably rasterizes all vectors having a particular width at the same time. This speeds up the computational process. Specialized shapes, such as the outline of circles in the case of printed circuit board layouts, are computed and stored in a table. This eliminates much of the subsequent computation which would otherwise be needed for determining the particular coordinates of such specialized shapes, such as circular pads and semicircular ends.

The rasterization of the vector involves certain techniques, some used to speed up computational processes and some used to accommodate the fixed point nature of the microprocessor (MOTOROLA 68010) used in the preferred embodiment. For example, it is well recognized that when using the 68010, or similar microprocessors, addition is much quicker than multiplication so that addition is used whenever possible. If a value needs to be multiplied, it is often multiplied once and then stored to be used later for other purposes. For example, in the preferred embodiment the tangent of the angle of the vector between the Y-axis and the vector is equal to the change in X (dx) divided by the change in Y (dy). Because of the lack of floating point numbers in the microprocessor, dx is in effect multiplied (by shifting) by the largest 16-bit hexadecimal number, then divided by dy, this value being rounded off to a 16-bit fixed point number called RATIO. RATIO approximates the tangent of the vector angle. To determine the cosine of vector angle, the value of RATIO is used as an index into a precomputed tangent-to-cosine table stored in the computer's memory. Although the value from the table is not exactly equal to the cosine of the vector angle, due to the various rounding off of values, it has been found to be sufficiently accurate for purposes of the plotting.

Other software methodology employed with the present invention is described in the following detailed description of the preferred embodiment of the invention.

Other features and advantages of the present invention will appear from the following description in which the preferred embodiment has been set forth in detail in conjunction with the accompanying drawings.

BRIEF DESCRIPTION OF THE DRAWINGS

FIG. 1 is a perspective view of a photoplotter made according to the invention with portions of the cabinet removed for clarity.

FIGS. 2A and 2B are perspective views taken along lines 2A—2A and 2B—2B of FIG. 1.

FIG. 2C is a partial cross-sectional view taken along line 2C—2C of FIG. 2A.

FIG. 3A is an exploded isometric view of the light head of the photoplotter of FIG. 1.

FIG. 3B is an enlarged cross-sectional view of the light head.

FIG. 3C is an enlarged cross-sectional view of an alternative embodiment of the light head of FIG. 3B.

FIG. 4 is a schematic representation showing a test strip having multiple photosensitive elements in relation to the light head for use in the control of the intensity of the various light sources carried by the light head.

FIG. 5 is a schematic diagram of various operational elements of the photoplotter of FIG. 1.

FIGS. 6A and 6B are simplified traces of an LED actuation signal and a broken actuation signal respectively.

FIG. 6C is a simplified block diagram of the LED intensity control circuitry.

FIG. 6D is a simplified trace of the broken LED actuation signal of FIG. 6B in which the energization period has been increased to permit gray tone images.

FIG. 7 is a simplified diagram illustrating the placement and movement of the light sources of the photoplotter of FIG. 1 over a printing medium.

FIG. 8 illustrates the interposition distance between columnar positions in the same column, the distance between corresponding columnar positions in adjacent columns and the overlap of adjacent light spots.

FIG. 9 illustrates a sample circuit path on the film in conjunction with the movement of light sources over the film and also illustrating the coordinates of the vector defining the length of the circuit path.

FIG. 10 is a simplified schematic representation of a portion of the circuit of FIG. 5.

FIGS. 11A–11B are flow diagrams for a portion of the control program illustrating the rasterization of the vector data.

FIGS. 12A–12E are five diagrams used to illustrate the steps in the flow diagram of FIGS. 11A–11B.

DETAILED DESCRIPTION OF THE PREFERRED EMBODIMENT

Overall Construction

Turning now to FIG. 1, photoplotter 2 will be described with reference to the overall machine construction. Photoplotter 2 includes a film bed 4 mounted to a frame 6 within a light-proof housing 8. Film bed 4 has a number of vacuum grooves 10 formed along its upper surface 12, grooves 10 being connected to a vacuum source 14. A partial vacuum within grooves 10 help keeps the printing medium, typically light sensitive film 16, flat on surface 12 of bed 4. It should be noted that although photoplotter 2 is shown with a stationary, flat film bed 4, with appropriate modification bed 4 could be in a different shape, for example cylindrical, or the film or the film bed could be moved.

Photoplotter 2 includes a carriage assembly 18 mounted to and moving along the lateral edges 20 of film bed 4 through pairs of grooved support rollers 22 which engage rods 23 secured to edges 20. Carriage assembly 18 supports a light head assembly 24 over bed 4. Assembly 24 includes a light head 26 within which numerous light sources, discussed in more detail below, are mounted. In this application light head 26 will be considered to be mounted over bed 4 even if upper surface 12 of bed 4 is not horizontal or if upper surface 12 actually faces downwardly. Appropriate control electronic components, not shown, are mounted beneath base 4 and are cooled by a pair of fans 27.

Briefly, an image is produced on light sensitive film 16 by moving carriage assembly 18 along the X-axis 28 by a computer-controlled X-axis stepper motor 29, while the various light sources 90, including LED's 60 and lenses 68 (see FIG. 3B) or lenses 68, 69 (see FIG. 3C), are illuminated at appropriate positions over film 16. Carriage assembly 18 is driven along X-axis 28, that is along the columnar direction, by X-axis stepper motor 29 through a traction drive 32 (see FIG. 2B) which engages a drive bar 34 secured at either end to the end plates 36 of frame 6. Other drivers, such as a lead screw, belt drive or similar apparatus, could be used instead of traction drive 32.

The X-axis position of carriage assembly is monitored by a linear encoder 31 such as sold by Teledyne Gurley of Troy, N.Y. as Model 8745 (see FIGS. 2A and 2B). Encoder 31 includes an encoded bar 33 mounted at either end to frame 6 parallel to X-axis 28 and a sensor 35 secured to assembly 18 and positioned adjacent bar 33. The signals from encoder 31 act to gate the illumination signals to light sources 90 so the light sources are illuminated at proper X-axis positions.

At the end of each pass along the X-axis, light head assembly 24 is indexed a short distance along the Y-axis 30 by actuating the Y-axis actuator 115. Carriage assembly 18 reverses direction along X-axis 28 and moves back over film 16 and film bed 4 in the reverse columnar direction. Light sources 90 are again illuminated at appropriate positions to create the desired image on film 16. The process is repeated until the entire image area of film 16 has been passed over by light sources 90 in light head assembly 24.

Light head assembly 24 is accurately positioned above film 16 on bed 4 by a pair of Z-axis stepper motors 38. Motors 38 are used to raise and lower carriage assembly 18 and light head assembly 24 therewith along the Z-axis 40.

Light Head 26

Referring now also to FIGS. 3A and 3B, light head 26 is secured at its ends 42, 44 to mounting blocks 46. Light head 26 includes a series of bores 48 formed completely through head 26 and extending from a datum surface 50 to an opposite surface 52. Bores 48 are formed in a straight line at an identical chosen common interval 53. Interval 53, in this preferred embodiment, is equal to 0.1 inch or 2.54 mm. In the preferred embodiment 160 separate bores 48 are formed in light head 26 for a total image area width of 16 inches or 40.6 centimeters.

Bore 48 includes a lens receiving portion 54 adjacent datum surface 50 and a light source receiving portion 56 adjacent opposite surface 52. Portions 54, 56 are coupled by a narrowed aperture 58 therebetween. An LED 60 is mounted within portion 56. LED 60 is connected to a printed circuit board 62 through its leads 64, board 62 being mounted against surface 52. LED 60 is fully and securely positioned within portion 56 through the use of a spongy material 66 between LED 60 and board 62.

A generally cylindrical rod lens 68 is mounted within lens receiving portion 54 of each bore 48. Outer surface 70 of lens 68 is preferably coplanar with datum surface 50. Lens 68 is of a type in which the index of refraction varies according to radial position. This characteristic allows lens 68 to have flat surfaces at either end and still cause the light to converge at a focal point 72. Lens 68 is of the type sold under the trademark SELFOC by NSG of America of Somerset, N.J., By using this type of lens and positioning its outer surface 70 coplanar with datum surface 50, focal points 72 will be the same distance from datum surface 50 for uniformity of focus. This construction also allows a desired height above film 16 to be easily and quickly obtained for different thicknesses of film 16.

To obtain the desired height, the user actuates Z-axis stepper motors 38 until datum surface 50 touches bed 4. Light head assembly 24 is then raised along Z-axis 40 by stepper motors 38 a desired distance above bed 4 with an appropriate distance added to account for the thickness of film 16. Alternatively, light head assembly 24 could be lowered to touch film 16 on bed 4 and then raised an appropriate distance. This is preferably done virtually automatically under control of a computer 88 (see FIG. 5) as part of an initiation sequence.

Another deceptively important feature of light head 26 is the means by which lenses 68 are secured within bores 48. To do so, a slot 76 is formed along the length of light head 26 sufficiently deep so that slot 76 intersects lens receiving portions 54 of bores 48 a short distance. Lenses 68 are properly positioned within bores 48 when outer surfaces 70 are coplanar with datum surface 50. A resilient cushion ring 78 is positioned within slot 76 and is secured there by an L-bracket 80. L-bracket 80 is secured along its length to light head 26 by screws 82. Cushion ring 78 is biased against the sides of lenses 68 by L-bracket 80 to gently but securely maintain lenses 68 within bores 48 simply and without shifting. Ring 78 is preferably made from a material, such as NBR, silicone or other rubberized material, which has a high friction outer surface so to help keep lenses 68 from shifting in bores 48. This arrangement permits the simple but accurate placement and securement of lenses 68 with respect to datum surface 50.

Referring now to FIG. 3C an alternative embodiment of light head 26 is shown. Light head 26' is similar to light head 26 and like numerals designate like elements. Light head 26' includes a top half 226 and a bottom half 228 separated by an aperture mask 230 defining apertures 58' therein. Top half 226 and bottom half 228 are shown spaced apart to more clearly show mask 230. Portion 56' is longer than portion 56 and houses a rod lens 69 as well as LED 60. Other lens combinations and configurations for the light head are also possible.

Intensity Control

Commercially available LED's 60 do not produce light of equal intensities for the same input. However, in most circumstances photoplotter 2 needs to have the light intensity of each LED 60 to be equalized to produce a proper image on film 16, or other media sensitive to electromagnetic radiation. Rather than attempting to modify the level of the input signal to each LED, a brightness equalization routine is initially conducted, typically at the factory. This routine involves the use of a test element 84 (see FIG. 4) supported beneath light head 26 for movement parallel to light head 26. Test element 84 is connected to computer 88 (see FIG. 5), which controls the functions of photoplotter 2. Once light head 26 is properly positioned over test element 84, LED's 60 are illuminated one at a time so to shine on element 84 as element 84 is positioned beneath each LED 60. The output from element 84 for each LED 60 is stored in permanent memory in computer 88 for use in equalizing the intensity of the light emanating from light sources 90 (see FIG. 3B). This information from test strip 84 is used by computer 88 in the following manner.

Referring now to FIGS. 6A and 6B, an LED actuation signal 92 is shown as a square wave. The energization level 94 is coextensive with the energization period 96. However, as shown in 6B, the energization period 96 for LED's 60 can be broken into a leading segment 98 and a trailing segment 100, during which LED 60 is energized, and an intermediate segment 101, during which the LED 60 is not energized. Thus, the light sources 90 with the lowest or smallest output, as measured by test strip 84, may be supplied a continuous LED actuation signal 92 during the entire energization period 94 as shown in FIG. 6A during use in creating an image on film 16. However, the light sources 90 which have been measured by test strip 84 to produce greater outputs are provided a broken signal 97 (see FIG. 6B) and therefore are energized during leading and trailing segments 98, 100 of period 96. The duration of segments 98, 100 are chosen according to the light intensity values stored in computer 88 from test element 84.

For example, the output from the light source 90 having the lowest output as measured by test element 84 can be considered the standard or base output. Outputs from light sources 90 which are greater are combined by computer 88 in the form of a fraction with the smaller output value being divided by the larger output to form a fraction. This fraction corresponds to the fraction created by dividing segments 98 and 100 by period 96. Assume the light intensity value for the LED 60 having the lowest output is 6 units and the intensity value for another LED 60 is 8 units. The fraction would be 6÷8 or ¾ so that the intermediate segment 101 would be ¼ of period 96 while leading and trailing segments 98, 100 would total ¾ of period 96.

It has been found to be preferable to modify the duration of the illumination of light sources 90 in the manner shown in FIG. 6B, rather than simply illuminating the LED for one continuous but shortened illumination segment. A single but shortened energization period can create images in which edges parallel to Y-axis 30 (that is parallel to light head 26) are poorly defined or staircased. This occurs because light head 26 moves constantly along X-axis 28 so that the region of film 16 illuminated by light sources 90 depends in part on when during period 96 the LED is illuminated. Therefore, if the illumination of two adjacent LED's 60 is started or stopped at slightly different times during period 96, image edges parallel or generally parallel to light head 26 will not be even since one one LED would start and/or stop before the other.

In the preferred embodiment period 96, which is typically one millisecond in length, is broken up into 100 subsegments by computer 88. A greater or a lesser number of segments could be used if desired. Some sacrifice of intensity adjustment will occur when fewer segments are used. Also, it is possible that in addition to the leading and trailing segments 98, 100, one or more intermediate energization segments, not shown, could be used as well. However, it has not been found to be necessary to provide such intermediate segments with the preferred embodiment. Segments 98, 100 could be of different durations as well.

Referring now to FIG. 6C, a simplified block diagram illustrating LED intensity control circuitry 184, a part of computer 88, is shown. Broadly, circuitry 184 includes twenty 8-bit LED drivers 186 to accommodate the 160 LEDs 60 on row 102, two static rams 188, a data address counter 190, a mask address counter 192, an address multiplexer 194 connected to the two counters 190, 192, a four line to sixteen line demultiplexer 196, and associated circuitries.

Static rams 188 contain both plot data, generated by computer 88 during the plot, and light source intensity equalizing mask data, computed initially using test element 84 and stored permanently in rams 188. The first ten words in ram 188 contains the image data for one row. The remaining 2,038 words are available for mask data storage. Assuming, as discussed above, each energization period 96 is divided into 100 subsegments, the intensity mask for each LED consists of 100 bits. The bits representing leading and trailing segments 98,100 will be logic high while the bits representing intermediate segment 101 will be logic low. Assume that intermediate segment 101 for a particular light source 90 has been determined, by testing, to be 20% of energization period 96. In this case, leading and trailing segments would each be 40% of period 96. Assuming that period 96 is broken up into 100 subsegments, 40 bits representing leading and trailing segments 98, 100 would each be set at logic high and the 20 bits representing intermediate segment 101 would be set at logic low. This set of the logic high and low bits for the leading, trailing and intermediate segments, determined separately for each light source 90, acts as a mask in the manner discussed below.

During operation the CPU (not shown) of computer 88 writes a row of image data (that is, information whether or not each light source 90 will be illuminated at that particular row) into static rams 188. The CPU then initiates the image cycle by asserting an image signal on image line 198 to control logic 200. Control logic 200 then initializes data address counter 190 to address 0, initializes mask address counter 192 to address 10 and sets a select line 202 (which connects control logic 200 with address multiplexer 194) at logic high. When select line 202 is at logic high, the multiplexed address (MADD) provided on a line 204 (which connects address multiplexer 194 to the address bus of rams 188) by address multiplexer 194 is the data address. The data address is provided to address multiplexer 194 along data address line 208. When select line 202 is logic low, address multiplexer 194 provides line 204 with the mask address provided from mask address counter 192 along mask address line 206.

While select line 202 remains at logic high the first word (16 bits) of image data is read from rams 188 (8 bits from each ram) and latched into associated 8-bit latches 210. Thereafter, select line 202 is set to logic low which gates the mask address (initially address 10) to static rams 188. The 16-bit mask value for the first sixteen subsections of energization period 96 is anded at 212 (8 bits for each AND 212) with the previously stored image data in latches 210. The result is written to the first pair of LED drivers 186, identified as 1 and 2 in FIG. 6C, by actuating demultiplexer 196 through a demux enable line 214 (which connects control logic 200 to demultiplexer 196). As a result of this, any LED for which a logic high is stored in both the data location (that is, that position over film 16 which is to be illuminated) and the corresponding mask location (that is, that a particular subsegment along energization period 96 which is within either leading segment 98 or trailing segment 100) in ram 188 will be turned on for that subsubsegment of energization period 96. If either or both of the data or mask is logic low, then the LED will not be turned on for that subsegment of period 96.

Thereafter select line 202 is reset to a logic high, data and mask address counters 190, 192 are incremented, setting them to addresses of 1 and 11, respectively. The above-steps, starting with reading the image data from rams 188, are repeated until data address counter 190 reaches 9 and mask address counter reaches 19. After this occurs, data address counters 190 is reset to 0 while mask address counter is incremented to 20. This process repeats for each position of light head assembly 24 along X-axis 28.

Turning now to FIG. 6D, a broken signal 97 is shown illustrating result of a global intensity modification or trim. The duty cycle of the energization period 96 is defined as the ratio of the length of the energization period 96 to the length 99 between the start of energization periods. Note that in FIG. 6B and 6D lengths 99 and 99' are the same lengths. However energization period 96' is longer than period 96, thus indicating a longer duty cycle. Therefore, global intensity modification can be accomplished by simply changing the duty cycle; this leaves the relative percentage of "on" time for each LED 60 the same, but simply increases or decreases the energization period for all the LEDs. This can be accomplished by rewriting the mask data in rams 188.

Changing the duty cycle can be done for each LED 60 at columnar position 110. This would allow the creation of a gray scale plotter. In such a case the image data could be represented by a multi-bit word designating whether the particular LED 60 will be maximum brightness, not illuminated or somewhere between. This gray scale information could then be combined with the basic mask information re-written row-by-row into rams 188.

In the preferred embodiment rams 188 are physically located as a part of light head assembly 24. Since the mask data for each assembly 24 remains with such light head assembly 24, even in the absence of power, light head assemblies 24 can be exchanged among photoplotters 2. Also, a light head assembly 24 can be returned to the factory for repair or for recalculation of the mask data if the relative intensities of the various LEDs has changed over time.

Columnar Addressing

FIG. 7 shows a simplified representation of a row 102 of light sources 90 mounted over film 16. Film 16 has an image area width, parallel to Y-axis 30, of about 16 inches (40.64 cm) and an image area length, parallel to X-axis 28, of about 20 inches (50.8 cm). Light sources 90 are moved parallel to X-axis 28 along columns 104 from one end 106 of film 16 to another end 108 of film 16 through traction drive 32. Columns 104 are divided into numerous columnar positions 110 each, in the preferred embodiment, having an interposition distance 111 of 0.001 inch or 0.0254 mm. See FIG. 8. When row 102 of light sources 90 are at a set of columnar positions 110 computer 88 actuates the appropriate ones of light sources 90 to illuminate the underlying positions 110 on film 16. Although the columnar positions 110 are 0.0254 mm apart, the diameter of light spots 112 from light sources 90 are preferably about five times greater than that distance so that the individual light spots 112 overlap substantially. This results in the image edges being relatively smooth.

Once row 102 of light sources 90 reaches the end of columns 104 adjacent another end 108 of film 16, light head 26, and thus row 102, indexes in a direction parallel to Y-axis 30 (to the right in FIG. 7) an index distance 114. This movement is illustrated in FIG. 7 on a greatly expanded horizontal scale. Index distance 114 is, in this preferred embodiment, equal to the distance between columnar positions 110, that is 0.0254 mm. After indexing, which is accomplished by the actuation of Y-axis stepper motor 115, X-axis stepper motor 29, through traction drive 32, moves row 102 parallel to X-axis 28 back towards one end 106 of film 16 while computer 88 illuminates light sources 90 at the appropriate columnar positions 110 along reverse columns 116. Since index distance 114 is 1/100 of the chosen common interval 53 between light sources 90, after fifty complete cycles (100 passes) of carriage assembly 18, the entire image plot on film 16 will be accomplished. For many plots one or more of light sources 90 will not be illuminated during one or more of passes along columns 104 and reverse columns 116.

Software—General Description of Columnar Rasterization

A generalized description of the software used with photoplotter 2 as it relates to the columnar rasterization will now be provided.

In creating film masks for printed circuit boards, the shapes of the images can be broken up into three basic shapes—circles, rectangles and ovals. Ovals are actually elongate rectangles with semicircular ends. Referring now to FIG. 9, a typical circuit path 120 having a rectangular central section 122 and hemispherical end sections 124, 126 is shown. The path of movement of only one light source 90 along column 104 is illustrated for convenience. As light source 90 moves along column 104, light source 90 is illuminated at a series of positions 110 which lie within circuit path 120. The general method for doing this is discussed below.

The following conventions will be followed. Path 120 is defined by its end points V1 and V2, having coordinates X1, Y1 and X2, Y2, its width W and the fact that it has hemispherical end sections 124, 126. End points V1, V2 thus define a vector 130. Circuit path 120 is provided to computer 88 by a vector input 128 (see FIG. 5). Since distances 111 and 114 are both 0.001 inch 0.0254 mm), one square inch of film 16 contains 1 million columnar positions 110 (155.000 positions 110 per square centimeter). The image area of film 16, which measures 16 inches (40.64 cm)×20 inches (50.8 cm), contains 320 million columnar positions 110, also called pixels. If desired the invention could be used with a system in which the entire image to be printed is stored. Because of the huge amount of memory which would be required to store all the rasterized information for the full area of film 16, the preferred embodiment of the present invention, as shown in FIG. 10, rasterizes and stores data for the columnar positions 110 for each of the 160 light sources 90 for one pass of light head 26 between ends 106, 108. This technique is called columnar addressing. Since there are fifty columns 104 and fifty reverse columns 116 for each light source 90, this reduces the total memory required from 320 million bits to 3.2 million bits for each pass of light sources 90.

To keep from unnecessarily slowing down the operation of photoplotter 2, computer 88 uses a pair of dynamic random access memories (DRAM) 132, 133. Each DRAM 132, 133 is capable of containing all of the bit-mapped data for each pass of light head 26, that is 3.2 million bits for the preferred embodiment. Each DRAM 132, 133 is a bit map of each columnar position 110 indicating whether the appropriate LED 60 at each position 110 is on (activated) or off (deactivated). During each pass along columns 104 and reverse columns 116. CPU 133 actuates LED's 60 according to the values in the appropriate DRAM 132 or DRAM 133 under the gating control of linear encoder 31: while doing so CPU 133 simultaneously computes and writes the information needed for the next columnar pass into the other of DRAM 133, 132. In this way no appreciable time delay is encountered during the operation of photoplotter 2 since the rasterization is done on-the-fly.

In the preferred embodiment a MOTOROLA 68010microprocessor is used. In the preferred embodiment the input data is coded in the RS-274-D format, which is an ANSI/EIA standard graphic programming language.

Software—Flow Diagram for Rasterization Program

The rasterization program is specially adapted to accommodate the columnar addressing system of the invention. Turning now to FIGS. 11A–11B, a flow diagram for the rasterization program will be discussed for the nth pass of rasterization.

After start 134, the lowest value vector width W is retrieved at 136. With the language used, ninety width codes, 10–99, corresponding to ninety possible widths, are possible. After the first width code W (10) is retrieved, a decision is made at 138 whether there are any vectors having that width W. If yes, then the points for a semicircle having a diameter W are computed and stored in a RAM 139 (see FIG. 10) at 140. This is done to save time computing the circular points later on for all other vectors of the same width. If desired the outline for a full circle or even an eighth of a circle could be computed and stored; the full circle would require less subsequent computation time, but more memory, than the semicircle while the eighth circle require somewhat more subsequent computation time, but less memory. At 142 the next vector having width W is rasterized as shown starting at 144 at FIG. 11B.

At 144 if the vector is either a horizontal line, a vertical line or a line at a 45° angle, special relationships exist which simplify, and thus speed up, the computations. These special cases will not be dealt with separately. In other (general) cases the program continues to 146. The horizontal (X-axis 28) and vertical (Y-axis 30) distances between points V1 and V2 are determined at 146. See FIGS. 12A and 12D. If dx is less than dy at 148, this means that the line is closer to a vertical than a horizontal. Note that the following discussion will assume that a vector is closer to a vertical. Similar procedures are used for vectors closer to a horizontal.

At 150 a 16-bit fixed point number called RATIO, which approximately represents the tangent of angle $a$, see FIG. 12A, is computed as a fixed point integer. Note that 10000H represents the largest 16-bit hexadecimal number. It is necessary that this be done because of the lack of floating point with the microprocessor used. Computations could be done using floating point numbers by appropriate programming. However, such would slow down the operation. At 152 the highest order eleven bits of RATIO are used to compute C=cos—atan [RATIO]. Cos—atan is the name of a precomputed table stored in RAM 139. The table value cos—atan[X] is approximately equal to mathematical quantity $\cos(\mathrm{atan}(X))$. Note that by convention the value in brackets [ ] is obtainable through table access.

At 154 distances WX, XB, XR, XL and XT are computed from their simple geometric relationships, keeping in mind that "C" is approximately equal to $\cos(a)$. As indicated in FIG. 12D, T, R, L and B indicate the top, top right, lower left and bottom, respectively, corners of section 122 of path 120. At 156 the Y coordinates for the four corners of rectangular central section 122 are computed using the X coordinates computed at 154 and the previously computed CIRCLE-TABLE values since the corners of section 122 are on the circumference of a pair of circles with diameter W and centers at V1 and V2. This saves computation time over computing the Y coordinates in the same manner as the X coordinates are computed.

At 158 point U, shown at FIG. 12E is determined. Point U is the point along line segment LT at which the lowest LED 60 intersects line LT as LED 60 moves parallel to X-axis 28. This LED 60 is identified as LED m at FIG. 12E. Step 158 illustrates the formula used to find coordinate YU (that is, the Y coordinate for point U in FIG. 12E). Since multiplication is timeconsuming, the values of YU for each pass are retrieved from the precomputed table ROWY so there is no need to actually multiply.

Next, at 160, the X coordinate at point U (XU) and the X coordinate at point S (XS) are computed using the previously computed value of RATIO, which is approximately equal the tangent of angle $a$.

At 162 quantities XP1, XP2 and YP are set equal to XU, XS and YU respectively. At 164 all the points having X-axis coordinates from XP1 to XP2 and the common Y-axis coordinate of YP are drawn thus forming the line US shown at FIG. 12E. The term "draw" refers to setting the appropriate bits in DRAM's 132, 133 so that when a DRAM is read, the appropriate LED 60 will be illuminated when it passes over points 110 between U and S. At 166 YP is incremented by δ, δ being the total number of passes, 100 in the preferred embodiment. The X coordinates XP1 and XP2 for points P1 and P2 for the common Y coordinate YP are computed by using the previously computed XP1 and XP2 values and adding the previously computed XP1 and XP2 values to the computed value of δ * RATIO. Note that δ * RATIO is a 32 bit fixed point number (the first 16 bits being an implied integer and the second 16 bits being an implied fraction) which needs to be computed only once per vector.

At 168 whether the line having the newly computed Y coordinate YP (in this case for LED m+1) will be above point R is determined. Since it is not, we repeat step 164 and draw the line from P1 to P2. Steps 166 and 168 are repeated and new values are computed for LED m+2 (not shown).

Once the recomputed coordinate YP is found to be greater than YR, coordinate XP2 is set equal to X2, which is the X coordinate for V2, at step 170. This limits the X boundary to a vertical line 171 (see FIG. 12B) for Y coordinates between YR and YT. Next, at step 172 it is determined if YP is greater than YT. If it is not then steps 164, 166 and 168 will be repeated to draw the line from line LT to line 171. If YP is greater than YT (which means the next LED 60 would pass above point T), then XP2 is reset to be equal to XS minus the precomputed value of (δ * RATIO) and YP is reset to be equal to YU-δ. This is done to pick up any LED's 60 which may pass through line LB. Note that in FIG. 12E. LED's m and m+1 are shown quite far apart for purposes of illustration. In this case, as indicated at step 176. YP will be less than YB so that the vector rasterization subroutine initiated at step 142 will be finished since LED m−1 (not shown) would pass beneath point B. If YP is not less than YB, then a line, as indicated at FIG. 12B, starting at line 177 and extending to the right of line 177 to line BR will be drawn. Steps 174 and 176 are repeated as necessary.

Returning now to FIG. 11A at step 180, the two circles at the end points V1, V2 of vector 130 are drawn in. See FIG. 12C. The circular points are retrieved from the precomputed array "CIRCLE-TABLE" stored in RAM 139. Note that the double cross-hatched portions of the areas encompassed by the circles will be "drawn in" twice. That does not affect anything since the appropriate bits were previously set in DRAM 132 or 133 so that another set signal from CPU 133 will not affect the bit. It has been found to be simpler to allow this to occur rather than trying to remove those points from the circle rasterization step 180.

At 182 any further vectors with the same width W are retrieved and rasterized according to steps 142–180. If there are no more vectors with the same width W, the next available width is fetched. If the prior width was the last width, then the program is finished with the rasterization of that pass. If not, step 138 is returned to and the appropriate steps are repeated.

Modification and variation can be made to the disclosed embodiment without departing from the subject of the invention as defined in the following claims. For example, instead of using stationary bed 4 and a movable light head 26, the bed could be moved and the light head could be stationary. Also, both could be made to move. The preferred embodiment has been discussed in terms of light sensitive film used for printed circuits. The photoplotter of the invention could be used for many other types of images to be produced using media sensitive to other types of electromagnetic radiation, such as X-rays. The rasterization program has been described with specific reference to the rasterization of vector data having widths and of particular shapes. Other shapes could be accommodated as well. If desired, the invention could be adapted to make color prints, such as by providing a set of carriage assemblies 18 each with its own set of light sources 90 corresponding to the three primary colors.

What is claimed is:

1. A serpentine columnar plotting method for creating an image of a resolution on a print region of a printing medium, the print region having a length and a width, comprising the following steps:
   (a) positioning a row of image markers along a marker direction generally parallel to the width, the image markers extending across substantially the entire width of the print region, the image markers spaced apart in the marker direction at a chosen common interval equal to at least three times the resolution;
   (b) moving, from a start location, the row of image markers and the printing medium relative to one another in a columnar direction transverse to the marker direction, the columnar direction being generally parallel to the length;
   (c) halting the relative movement of the row of image markers and the printing medium at a stop location;
   (d) indexing the row of image markers and the printing medium relative to one another an index distance generally parallel to the marker direction;
   (e) moving the row of image markers and the printing medium relative to one another in a return direction, parallel to and opposite the columnar direction, to the start columnar location after the indexing step (d); and
   (f) actuating the image markers at chosen columnar positions for imaging image marks on the printing medium during the moving steps (b) and (e);
   (g) indexing, in the marker direction after the moving step (e), the row of image markers and the printing medium relative to one another;
   (h) repeating steps (b) through (g) a chosen number of times, the actuating step including:
      (i) receiving vector input data from a vector input source;
      (j) computing a first set of image mark data for each columnar position for each image marker during the movement of the image markers from a first set of start locations to a first set of stop locations;
      (k) writing the first set of image mark data into a first memory area;
      (l) computing a second set of image mark data from each columnar position for each image marker during subsequent movement of the image markers from a second set of start locations to a second set of stop locations;
      (m) writing the second set of image mark data into a second memory area;

(n) actuating the image markers according to the image mark data in the first memory area during the computing step (l) and the wiring step (m); and (o) actuating the image markers according to the image mark data in the second memory area during the computing step (j) and the writing step (k).

2. The method of claim 1 wherein the image markers include LED's.

3. The method of claim 1 wherein the columnar direction is perpendicular to the marker direction.

4. The method of claim 1 wherein the image marks have a dimension in the columnar direction substantially greater than the distance between the chosen columnar positions so the image marks overlap when chosen ones of the image markers are actuated at successive columnar positions.

5. The method of claim 1 wherein the image marks have dimensions in the marker direction substantially greater than the index distance so image marks in adjacent columns at corresponding columnar positions overlap.

6. The method of claim 1 wherein the chosen number of times is equal to one half of the result of the chosen common interval divided by the index distance.

7. The method of claim 1 wherein the index distance is equal to 0.0254 mm.

8. The method of claim 7 wherein the chosen common interval is equal to 2.54 mm.

9. The method of claim 1 wherein the row of image markers move during moving step (b).

10. The method of claim 1 wherein the row of image markers move during indexing step (d).

11. The method of claim 1 further comprising the step of selecting the index distance to be equal to the resolution.

12. A columnar addressing method for use with a raster photoplotter to create an image on an image region on a film, the image region having a length and a width, the image having a resolution, comprising the following steps:

(a) positioning a row of light sources along a light source direction generally parallel to the width and across substantially the entire width of the image region at a chosen common interval between one another, the chosen common interval being at least ten times the resolution;

(b) moving, from a start location, the row of light sources over the film in a columnar direction perpendicular to the light source direction and generally parallel to the length;

(c) halting the movement of the row of light sources at a stop location;

(d) indexing the row of light sources an index distance parallel to the light source direction, the index distance being equal to the resolution;

(e) following the indexing step (d), moving the row of light sources in a return direction, parallel to and opposite the columnar direction, to the start columnar location;

(f) actuating the light sources at chosen columnar positions for creating marks on the printing medium during the moving steps (b) and (e), the marks having dimensions in the columnar and marker directions substantially greater than the index distance and the distance between the chosen columnar positions so the marks overlap when chosen ones of the light sources are actuated at successive columnar positions and at corresponding columnar positions, respectively;

(g) indexing the row of light sources the index distance in the light source direction after the moving step (e); and (h) repeating steps (b) through (g) a chosen number of times, the actuating step including:

(i) receiving vector input data from a vector input source;

(j) computing a first set of mark data for each columnar position for each light source during the movement of the light source from a chosen one of the start and stop locations to the other of the start and stop locations;

(k) writing the first set of mark data into a first memory area;

(l) computing a second set of mark data for each columnar position for each light source during subsequent movement of the light sources from the other of the star and stop locations to the chosen one of the start and stop locations;

(m) writing the second set of mark data into a second memory area;

(n) actuating the light sources according to the mark data in the first memory area during the computing step (e) and the writing step (m);

(o) actuating the light sources according to the mark data in the second memory area during the computing step (j) and the writing step (k); and (p) repeating steps (i) through (o).

13. A method for actuating light sources using a vector-to-raster conversion of vector data by a raster photoplotter of the type including a row of spaced apart light sources arranged in a light source direction parallel to a first film dimension, the row of light sources being moved back and forth in columnar directions perpendicular to the light source direction and parallel to a second film dimension with the row of light sources being indexed in the light source direction towards the ends of the film, the method comprising:

(a) receiving vector input data from a vector input source;

(b) computing a first set of mark data for each columnar position for each light source during the movement of the light sources from a first set of start locations to a first set of stop locations;

(c) writing the first set of mark data into a first memory area;

(d) computing a second set of mark data for each columnar position for each light source during subsequent movement of the light sources from a second set of start locations to a second set of stop locations;

(e) writing the second set of mark data into a second memory area;

(f) actuating the light sources according to the mark data in the first memory area during the computing step (d) and the writing step (e);

(g) actuating the light sources according to the mark data in the second memory area during the computing step (b) and the writing step (c); and (h) repeating steps (a) through (g).

14. A serpentine columnar plotting method for creating an image on a printing medium, comprising the following steps:

(a) positioning a row of image markers along a marker direction;

(b) moving, from a start location, the row of image markers and the printing medium relative to one another in a columnar direction transverse to the marker direction;

(c) halting the relative movement of the row of image markers and the printing medium at a stop location;

(d) indexing the row of image markers and the printing medium relative to one another an index distance generally parallel to and opposite the marker direction;

(e) moving, after the indexing step, the row of image markers and the printing medium relative to one another in a return direction, parallel to and opposite the columnar direction, to the start columnar location;

(f) receiving vector input data from a vector input source;

(g) computing a first set of image mark data for each columnar position for each image marker during the movement of the image markers from a first set of start locations to a first set of stop locations;

(h) writing the first set of image mark data into a first memory area;

(i) computing a second set of image mark data from each columnar position for each image marker during subsequent movement of the image markers from a second set of start locations to a second set of stop locations;

(j) writing the second set of image mark data into a second memory area;

(k) actuating the image markers according to the image mark data in the first memory area during the computing step (i) and the wiring step (j);

(l) actuating the image markers according to the image mark data in the second memory area during the computing step (g) and the writing step (h);

(m) indexing, in the marker direction after the moving step (e), the row of image markers and the printing medium relative to one another; and (n) repeating steps (b) through (m) a chosen number of times.

15. A columnar addressing method for use with a raster photoplotter to create an image on a film, comprising the following steps:

(a) positioning a row of light sources along a light source direction at a chosen common interval between one another;

(b) moving, from a start location, the row of light sources over the film in a columnar direction perpendicular to the light source direction;

(c) halting the movement of the row of light sources at a stop location;

(d) indexing the row of light sources an index distance parallel to the light source direction;

(e) following the indexing step (d), moving the row of light sources in a return direction, parallel to and opposite the columnar direction, to the start columnar locations;

(f) actuating the light sources at chosen columnar positions for creating marks on the printing medium during the moving steps (b) and (e), the marks having dimensions in the columnar and marker directions substantially greater than the index distance and the distance between the chosen columnar positions so the marks overlap when chosen ones of the light sources are actuated ar successive columnar positions and at corresponding columnar positions, respectively, the actuating step including:

(g) receiving vector input data from a vector input source;

(h) computing a first set of mark data for each columnar position for each light source during the movement of the light source from a first set of start locations to a first set of stop locations;

(i) writing the first set of mark data into a first memory area;

(j) computing a second set of mark data for each columnar position for each light source during subsequent movement of the light sources from a second set of start locations to a second set of stop locations;

(k) writing the second set of mark data into a second memory area;

(l) actuating the light sources according to the mark data in the first memory area during the computing step (e) and the writing step (i);

(m) actuating the light sources according to the mark data in the second memory area during the computing step (h) and the writing step (i);

(n) indexing the row of light sources in the light source direction after the moving step (e); and (o) repeating steps (b) through (n) a chosen number of times.

* * * * *